United States Patent
Vaswani et al.

(10) Patent No.: US 11,049,837 B2
(45) Date of Patent: Jun. 29, 2021

(54) BOND WIRE ARRAY FOR PACKAGED SEMICONDUCTOR DEVICE

(71) Applicant: NXP USA, Inc., Austin, TX (US)

(72) Inventors: Jitesh Vaswani, Chandler, AZ (US); Scott Duncan Marshall, Chandler, AZ (US); Ricardo Uscola, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/528,389

(22) Filed: Jul. 31, 2019

(65) Prior Publication Data

US 2021/0035942 A1    Feb. 4, 2021

(51) Int. Cl.
*H01L 23/00* (2006.01)
*H03F 3/195* (2006.01)

(52) U.S. Cl.
CPC .............. *H01L 24/49* (2013.01); *H01L 24/48* (2013.01); *H03F 3/195* (2013.01); *H01L 2224/48091* (2013.01); *H01L 2224/4903* (2013.01); *H01L 2224/49175* (2013.01); *H01L 2224/49176* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 7,683,480 B2 | 3/2010 | Bokatius et al. | |
| 7,786,603 B2 | 8/2010 | Piel et al. | |
| 7,939,864 B1* | 5/2011 | Blednov | H03F 1/565 |
| | | | 257/275 |
| 9,450,283 B2* | 9/2016 | Blednov | H01L 23/66 |
| 9,589,927 B2 | 3/2017 | Szymanowski et al. | |
| 2004/0104456 A1* | 6/2004 | Duffy | H01L 24/85 |
| | | | 257/666 |
| 2010/0188164 A1* | 7/2010 | Blednov | H03H 7/383 |
| | | | 333/109 |

* cited by examiner

*Primary Examiner* — Zandra V Smith
*Assistant Examiner* — Lawrence C Tynes, Jr.

(57) ABSTRACT

A packaged radio frequency (RF) amplifier device includes a flange and a transistor die mounted to the flange. The transistor die includes an output terminal. The packaged RF amplifier device includes a first bond wire array including a first plurality of bond wires. Each bond wire in the first plurality of bond wires is electrically coupled to the output terminal of the transistor die. A first ground loop area of a first bond wire in the first plurality of bond wires is greater than a second ground loop area of a second bond wire in the first plurality of bond wires.

17 Claims, 13 Drawing Sheets

BOND WIRE ARRAY FOR PACKAGED SEMICONDUCTOR DEVICE

TECHNICAL FIELD

Embodiments of the subject matter herein relate generally to packaged semiconductor devices, and more particularly to bond wire configurations for packaged, radio frequency (RF) amplifiers including transistor devices.

BACKGROUND

A typical high power, radio frequency (RF) semiconductor device may include one or more input leads, one or more output leads, one or more transistors, bond wires coupling the input lead(s) to the transistor(s), bond wires coupling the transistor(s) to the output lead(s), and, potentially, additional bond wires interconnecting various other components of the RF semiconductor device.

In a typical RF semiconductor device, some of the bond wires may carry a relatively high current. For example, the bond wires carrying current from an output terminal of the device's transistor to the device's output impedance matching network may carry high current. In order to handle the relatively high current, a number of different bond wires may be connected in parallel between the output terminal of the transistor and an input terminal of the output impedance matching network. Such an array of bond wires may similarly be formed between other components of the RF semiconductor device to electrically interconnect those components and carry relatively high currents between those components.

When a high current is passed through a bond wire array, the current is not equally distributed between each of the bond wires in the array. Typically, the bond wires at the edge of the array (i.e., the outer bond wires) carry more current than the bond wires positioned towards the center of the array (i.e., the inner bond wires). The additional current passing through the outer bond wires causes those bond wires to heat-up more than the inner bond wires. Because, for reliable performance of the RF semiconductor device, it may be preferable that the bond wires not exceed a maximum temperature, this electric joule heating of the outer wires of the bond wire array, may determine a minimum diameter of the wire that can be used. Additionally, the heating of bond wire array outer wires may, in some cases, reduce a lifetime of the device.

DESCRIPTION OF THE DRAWINGS

A more complete understanding of the subject matter may be derived by referring to the detailed description and claims when considered in conjunction with the following figures:

DETAILED DESCRIPTION

Figure 1:
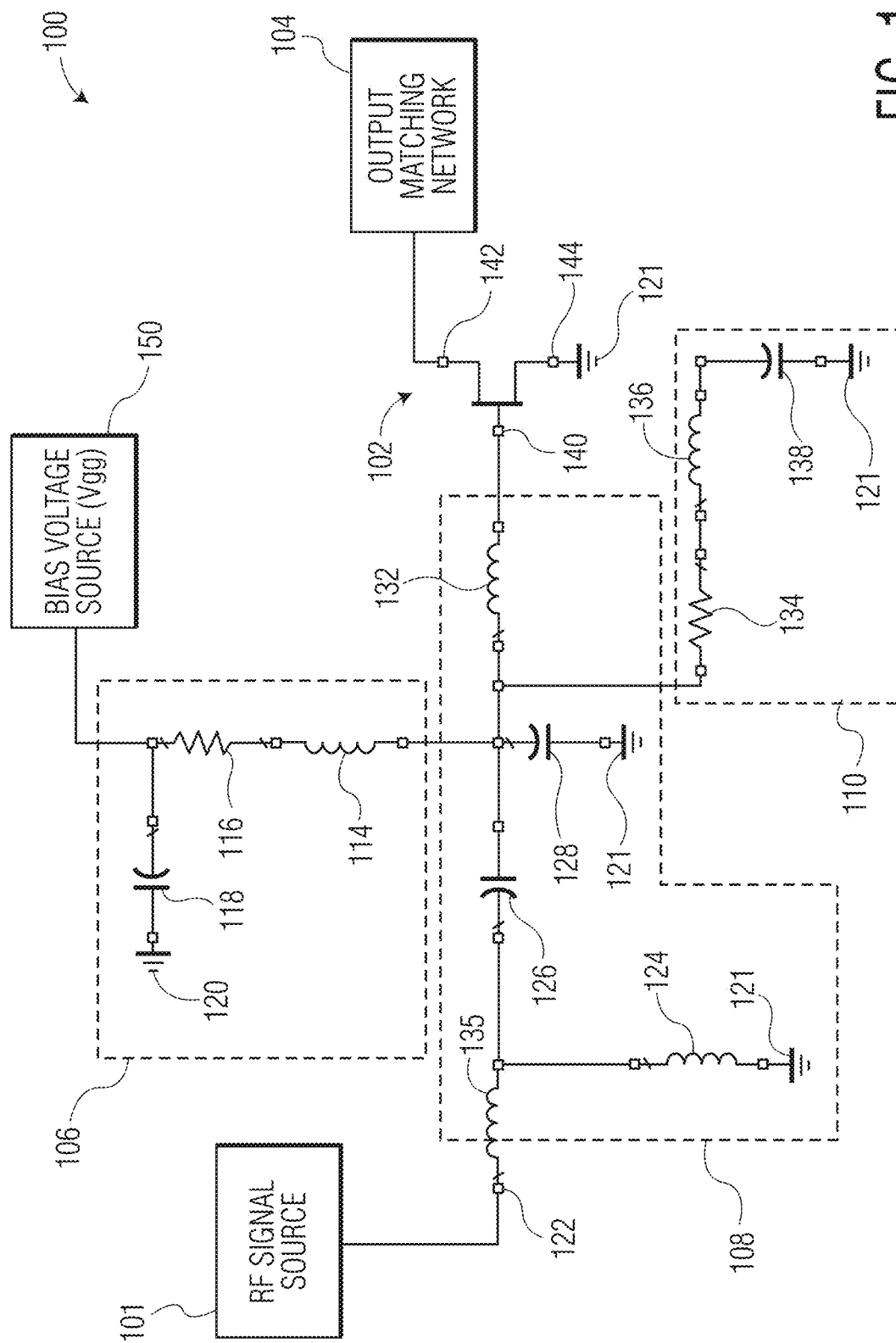
FIG. 1 is a diagram of an illustrative amplifier path that includes an amplifier having an input network and an output network, in accordance with an embodiment.

The present disclosure relates to bond wire configurations for use in radio frequency (RF) semiconductor devices including RF amplifiers. In typical RF semiconductor devices, bond wire arrays are used to electrically interconnect components of the device and in situations requiring the bond wire arrays to carry relatively high current that may exceed that current-carrying capacity of a single bond wire. Due to joule heating, as the current passes through each of the bond wires in the array, the bond wires heat up. If the bond wires exceed a maximum operating temperature, the bond wires may fail, resulting in a potential operational failure of the RF semiconductor device.

When a current passes through an array of bond wires, the current is not equally distributed across each of the bond wires. The outer wires of the bond wire array carry more current than the inner bond wires. Accordingly, the outer wires heat up more than the inner wires. This excessive heating of the outer bond wires limits the current carrying capacity of the bond wire array because the current passing through the array should not result in sufficient heating of the outer bond wires that their temperature exceed their maximum operational temperature. In some ways, the non-equal current distribution across the bond wire array can resemble the current distribution observed in a microstrip transmission lines, in which the current is highest in the edges of the transmission line.

If the current were to be more evenly distributed across bond wire arrays utilized within an RF semiconductor device such as an RF amplifier, the bond wire arrays may be capable of handling higher current levels without exceeding their maximum operational temperatures.

Within a bond wire array, the current distribution across each bond wire is determined by the impedance (which is primarily determined by the bond wire's inductance) of each individual bond wire. Bond wires with lower inductance will carry more current, while bond wires with higher inductance will carry less. In a conventional bond wire array, at particular operational frequencies, the bond wires at the edge of the array appear to have lower inductance than the inner wires and, as such, the outer wires carry more current and experience more heating. In the present disclosure, a bond wire array configuration is described in which the current passing through the array is equalized, at least in comparison to conventional bond wire array designs, across each bond wire in the array.

Specifically, the bond wire array is configured to reduce the inductance of bond wires towards the center of the array as compared to the inductance of the array's outer bond wires. By reducing the inductance of the inner bond wires, more current is forced through the inner bond wires and, conversely, less current through the outer bond wires. This normalizes current flow through the bond wires of the array and, thereby, the heating of the various bond wires. Unless otherwise noted, inner bond wires may refer to any bond wires of an array that are between the two outermost bond wires of an array. The outer bond wires of a bond wire array can refer to the two outermost bond wires of the array as well as other bond wires in the array that are nearby the outermost bond wires and are between the outermost bond wires and the inner bond wires.

In an embodiment, the inductance of the inner bond wires is reduced by reducing the ground loop area associated within the inner bond wires as compare to the outer bond wires. The ground loop area for a particular bond wire refers to the cross sectional area of the area under the bond wire that is outlined by the current flowing in the bond wire and the ground current flowing in the opposite direction in the flange underneath the bond wire. The greater then ground loop area for a particular bond wire, the greater the inductance of that bond wire. Accordingly, by reducing the ground loop area for inner bond wires, the inductance of those bond wires can be reduced compared to the outer bond wires.

Alternatively, more current can be forced through the inner bond wires of a particular bond wire array by increasing the inductance of the array's outer bond wires. Accordingly, in an embodiment, the geometry of the outer bond wires may be modified as compared to the inner bond wires to increase their relative inductance. Specifically, the length of the outer bond wires may be increased as compared to the inner bond wires of a particular array to increase the inductance of the outer bond wires thereby forcing more current through the inner bond wires.

FIG. 1 shows a block diagram of an example RF semiconductor device (e.g., a packaged radio frequency device) including amplifier system 100 that includes a transistor 102 having a gate terminal 140 (e.g., a control terminal), a source terminal 144 (e.g., an input terminal), and a drain terminal 142 (e.g., an output terminal). Source terminal 144 is connected to ground terminal 121 (e.g., ground reference node), which may be connected to a ground reference source, or which may be a ground plane of a package (e.g., package 200, FIG. 2) that houses amplifier system 100. Transistor 102 may be a High Electron Mobility Transistor (HEMT) formed on a semiconductor substrate. This is merely illustrative and transistor 102 may be any desired type of transistor, including a bi-polar junction transistor (BJT), a laterally diffused metal oxide semiconductor (LDMOS) field effect transistor (FET), or another type of field effect transistor. Transistor 102 may also be formed on any desired, suitable semiconductor substrate, including, but not limited to, gallium arsenide (GaAs), silicon carbide (SiC), silicon (Si), silicon-on-insulator (SoI), sapphire, gallium nitride (GaN), GaN on silicon, GaN on SiC, and indium phosphide (InP) substrates, although other substrates also may be suitable. For instances in which transistor 102 is a BJT transistor, gate terminal 140 will be instead be a base terminal, source terminal 144 will instead be an emitter terminal, and drain terminal 142 will instead be a collector terminal.

Amplifier system 100 includes an output matching network 104 connected between the drain terminal 142 of transistor 102 and a load (not illustrated). Output matching network 104 may include a variety of capacitive, resistive, and inductive components designed to match an output impedance of transistor 102 to a predefined impedance of the load that is driven by the amplifier system 100. The load may be, for example, an antenna driven by amplifier system 100. This output impedance matching may reduce the amount of signal reflection that occurs when an output signal of transistor 102 passes from drain terminal 142 to the load through output matching network 104, compared to the amount of signal reflection that would occur with a mismatched impedance between drain terminal 142 and the load.

Amplifier system 100 also includes input circuitry coupled to gate terminal 140 of transistor 102, which includes an input matching network 108, an internal baseband decoupling circuit 110, and an external baseband decoupling circuit 106. Input matching network 108 may match an input impedance of transistor 102 to a predefined impedance of an RF signal source 101 that supplies an input signal (e.g., RF signal) to input node 122 of input matching network 108. RF signal source 101 may be, for example, external circuitry that produces one or more RF signals and is electrically coupled (e.g., connected to) the input node 122 of the input matching network 108. Input matching network 108 is coupled between gate terminal 140 of transistor 102 and an input node 122, which may be, for example, one or more RF input/output (I/O) leads. Input matching network 108 includes inductance 135 having a first terminal coupled to input node 122, and an L-section match that includes an inductance 124 coupled between a second terminal of inductance 135 and ground terminal 121, and further includes a capacitor 126 coupled between the second terminal of inductance 135 and a node 130, which may act as an RF cold point.

Input matching network 108 further includes a capacitor 128 coupled between node 130 and ground terminal 121, and an inductance 132 coupled between the node 130 and the gate terminal 140 of transistor 102. Internal baseband decoupling circuit 110 is coupled between the node 130 and ground terminal 121. According to an embodiment, inductance 135 has an inductance value in a range of about 50 picohenries (pH) to about 100 pH, inductance 124 has an inductance value in a range of about 100 pH to about 350 pH, inductance 135 has an inductance value in a range of about 50 pH to about 100 pH, capacitor 126 has a capacitance value in a range of about 30 picofarads (pF) to about 75 pF, capacitor 128 has a capacitance value in a range of about 100 pF to about 300 pF, and inductance 132 has an inductance value in a range of about 10 pH to about 150 pH, although these components may have values that are lower or higher than these ranges, as well. Inductance 132 and capacitor 128 may, together, act as a low-pass filter, allowing lower frequency signal energy to pass from node 130 to gate terminal 140, while directing higher frequency signal energy to ground terminal 121. Inductance 124 and capacitor 126 may, together, act as a high-pass filter, allowing higher frequency (e.g., RF) signal energy to pass from input node 122 to node 130, while directing lower frequency signal energy to ground terminal 121. Together, the high-pass filter of inductance 124 and capacitor 126 combined with the low-pass filter of inductance 132 and capacitor 128 may act as a band-pass filter, allowing only signal energy within a predetermined frequency range (e.g., 1.5 GHz to 2.5 GHz) to pass from input node 122 to gate terminal 140. In this way, input matching network 108 may be a band-pass input matching network, and node 130 may be an RF cold point node (e.g., a node that provides a low-impedance path to ground for RF signal energy within a predetermined frequency range of the frequency range of the band-pass filter of input matching network 108).

Internal baseband decoupling circuit 110 includes resistor 134, inductance 136, and capacitor 138 coupled in series between node 130 and ground terminal 121. According to an embodiment, inductance 136 has an inductance value in a range of about 70 pH to about 300 pH, resistor 134 has a resistance value in a range of about 0.1 ohms to about 1 ohm, and capacitor 138 has a capacitance value in a range of about 0.5 nanofarads (nF) to about 30 nF, although these components may have values that are lower or higher than these ranges, as well.

Figure 2:
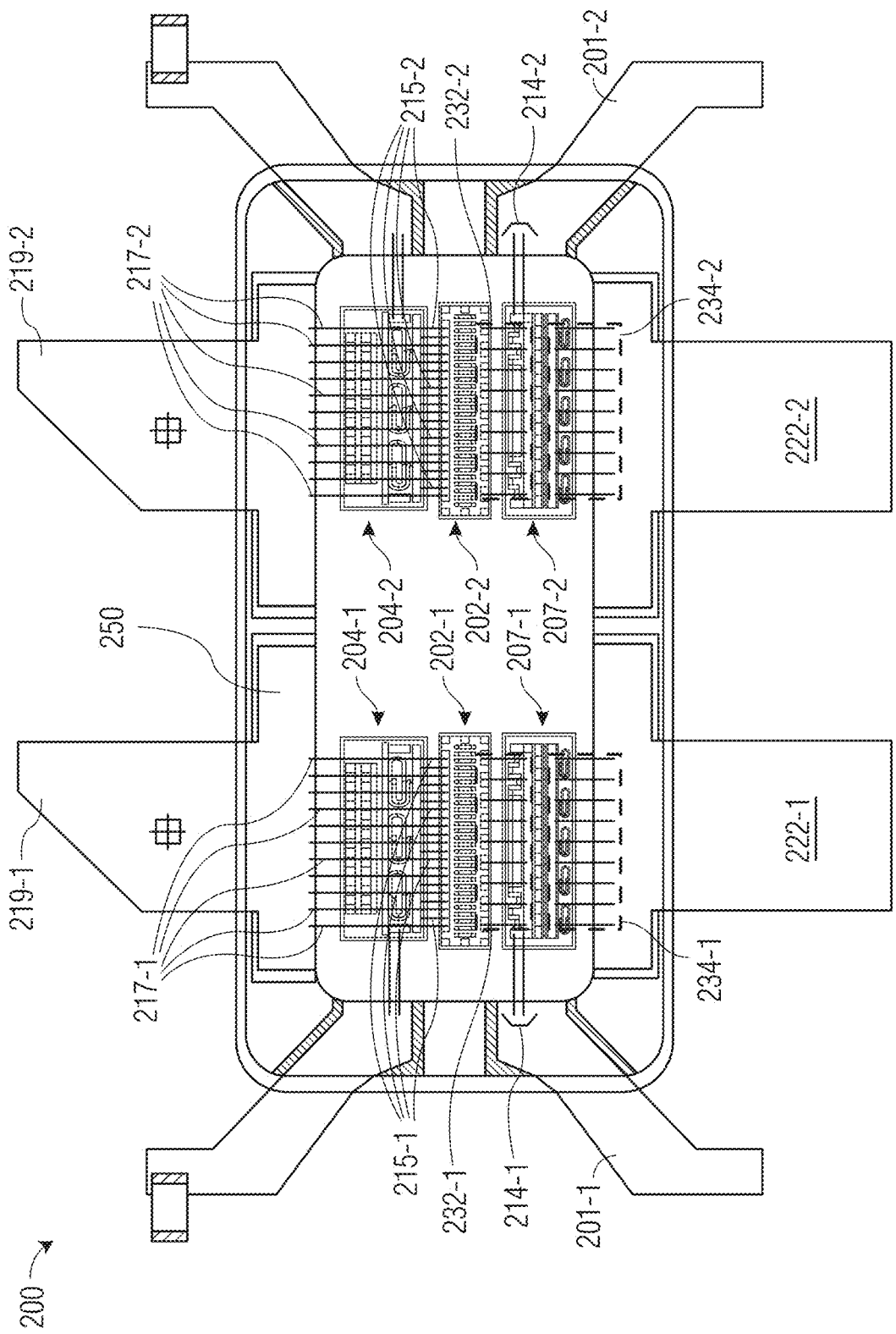
FIG. 2 shows a top-down view of an illustrative circuit package that may include an amplifier system, such as amplifier system 100 of FIG. 1.

External baseband decoupling circuitry 106 is coupled between node 130 and ground terminal 120 (e.g., a ground reference node that is coupled to an external ground reference that may, for example, be external to a package containing amplifier system 100, such as package 200, FIG. 2), which may be separate from ground terminal 121 or may be electrically connected to ground terminal 121, depending on how the package containing input matching network 108, internal baseband decoupling circuit 110, transistor 102, and output matching network 104 is arranged. External baseband decoupling circuit 106 includes an inductance 114, a resistance 116, and a capacitor 118 coupled in series between node 130 and ground terminal 120. In some embodiments, resistance 116 may be excluded. Ground terminal 120 may be an out-of-package (e.g., external) ground terminal that is different from ground terminal 121. Bias voltage source 150 may be coupled to a node between resistance 116 and capacitor 118, and may generate and provide a gate bias voltage Vgg for gate terminal 140. Alternatively, the bias voltage may be provided through an external gate bias circuit. According to an embodiment, inductance 114 has an inductance value in a range of about 200 pH to about 1000 pH, resistance 116 has a resistance value in a range of about 0.1 ohms to about 2 ohm, and capacitor 118 has a capacitance value in a range of about 1 microfarads (uF) to about 20 uF, although these components may have values that are lower or higher than these ranges, as well.

Baseband decoupling circuits 106 and 110 can be used to create low-impedance paths between node 130 and ground terminals 120 and 121, respectively, for baseband frequency signals that oscillate at baseband frequencies. Node 130 is an "RF cold point" in that, at RF frequencies, impedance at node 130 through internal baseband decoupling circuit 110 may be significantly greater (e.g., roughly 5 times greater) than the impedance at node 130 through capacitor 128. At node 130, external baseband decoupling circuit 106 may have an even greater impedance (e.g., roughly 30 times greater) than the impedance through capacitor 128 at RF frequencies. For example, at RF frequencies (e.g., frequencies greater than 1 GHz), as observed from node 130, capacitor 128 may exhibit an impedance between about 0.2 ohms and about 0.7 ohms, internal baseband decoupling circuit 110 may exhibit an impedance between about 1.2 ohms and about 5 ohms, and external baseband decoupling circuit 106 may exhibit an impedance between about 15 ohms and about 30 ohms. The capacitor 128 and circuits 110, 106 may exhibit lower or higher impedances than the above-given ranges, as well.

At low frequencies (e.g., baseband frequencies), current is directed to ground through baseband decoupling circuits 106 and 110, rather than through capacitor 128 or to gate 140 through inductance 132. External decoupling circuit 106 may provide the lowest impedance path to ground for signals having frequencies less than a first threshold (e.g., 30 megahertz (MHz)), while baseband decoupling circuit 110 may provide the lowest impedance path to ground for signals having frequencies between the first threshold (e.g., 30 MHz) and a second threshold (e.g., 1 GHz). For example, at baseband frequencies less than the first threshold, as observed from node 130, capacitor 128 may exhibit an impedance between about 20 ohms and about 1000 ohms, internal baseband decoupling circuit 110 may exhibit an impedance between about 1 ohm and about 6 ohms, and external baseband decoupling circuit 106 may exhibit an impedance between about 0.3 ohms and about 1 ohm. At baseband frequencies between the first threshold and the second threshold, as observed from node 130, capacitor 128 may exhibit an impedance between about 20 ohms and about 100 ohms, internal baseband decoupling circuit 110 may exhibit an impedance between about 0.5 ohms and about 1 ohm, and external baseband decoupling circuit 106 may exhibit an impedance between about 1 ohm and about 10 ohms. Once again, the capacitor 128 and circuits 110, 106 may exhibit lower or higher impedances than the above-given ranges, as well.

FIG. 2 shows a top-down view of an illustrative circuit package that may include an amplifier system, such as amplifier system 100 of FIG. 1. Package 200 includes a substrate 250 (or flange), two amplifiers 202-1, 202-2 (e.g., which may be arranged to operate as a Doherty or inverted Doherty amplifier system), two output matching networks 204-1, 204-2, two input matching networks including circuits 207-1, 207-2 and bond wires 234-1, 234-2, 232-1, 232-2, additional bond wires 214-1, 214-2, RF input leads 222-1, 222-2 (or gate supply leads), RF output leads 219-1, 219-2, and bias leads 201-1, 201-2. The amplifiers 202-1, 202-2 and matching networks 204-1, 204-2, 207-1, 207-2 are mounted to the top surface of substrate 250. The input and output leads 222-1, 222-2, 219-1, 219-2 also are coupled to substrate 250, although they are electrically isolated from substrate with a dielectric spacer (e.g., for an air-cavity device) or with dielectric molding compound (e.g., for an over-molded device). In addition, as will be described in more detail later, ground bond wires 616 also are connected to the top surface of substrate 250, which provides a ground reference for those bond wires 616.

Substrate 250 includes a rigid electrically-conductive substrate, which has a thickness that is sufficient to provide structural support for electrical components and elements of package 200. In addition, substrate 250 may function as a heat sink for amplifiers 202-1, 202-2 and other devices mounted on substrate 250. Substrate 250 has a top and bottom surface (only a central portion of the top surface is visible in FIG. 2), and a substantially-rectangular perimeter that corresponds to the perimeter of the package 200.

Substrate 250 is formed from a conductive material (e.g., bulk copper), and may be used to provide a ground reference for the package 200. For example, various components and elements may have terminals that are electrically coupled to substrate 250, and substrate 250 may be electrically coupled to a system ground when the package 200 is incorporated into a larger electrical system. At least the surface of substrate 250 is formed from a layer of conductive material, and possibly all of substrate 250 is formed from bulk conductive material. Alternatively, substrate 250 may have one or more layers of non-conductive material below its top surface. Either way, substrate 250 has a conductive top surface. Substrate 250 may more generally be referred to as a substrate with a conductive surface. To provide a ground reference, the conductive top surface of substrate 250 may be connected to a ground potential.

Each of amplifiers 202-1, 202-2 includes a semiconductor die in which a power transistor (e.g., a FET, HEMT, LDMOS FET, BJT, or other type of transistor) is integrally formed. The description herein refers to each amplifier or transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize BJT devices or other suitable types of transistors.

Each transistor within each amplifier 202-1, 202-2 includes a gate terminal (or control terminal or input terminal), a drain terminal (or first current-carrying terminal or output terminal), and a source terminal (or second current-carrying terminal), not numbered. In a specific embodiment, each transistor in amplifiers 202-1, 202-2 is an LDMOS FET, which includes an active area disposed between gate and drain terminals. Each active area includes a plurality of elongated, parallel-aligned, and interdigitated drain regions and source regions, where each drain region and each source region is a doped semiconductor region formed in the base semiconductor substrate. The source regions are electrically coupled to conductive (e.g., polysilicon or metal) source contacts, which in turn are coupled to conductive through substrate vias (TSVs) that extend through the base semiconductor substrate to connect with a conductive layer on the bottom surface of the base semiconductor substrate.

Each amplifier 202-1, 202-2 includes a first elongated conductive bond pad (or input bond pad) that is exposed at the top surface of each amplifier 202-1, 202-2, and which is electrically connected to the gate terminal of the amplifier 202-1, 202-2, and a second elongated conductive bond pad (or output bond pad) that is exposed at the top surface of each amplifier 202-1, 202-2, and which is electrically connected to the drain (or output) terminal of the amplifier 202-1, 202-2. Bond wires 215-1, 215-2 connect output terminals of amplifiers 202-1, 202-2 (or more specifically the output bond pads), respectively, to input terminals 204-1, 204-2, respectively of output matching networks 204-1, 204-2. Bond wires 217-1, 217-2 connect output terminals of amplifiers 202-1, 202-2 (or more specifically the output bond pads), respectively, to output package leads 219-1, 219-2. More specifically, first ends of the bond wires 215-1, 215-2, 217-1, 217-2 are connected to the output bond pads of amplifiers 202-1, 202-2. Second ends of bond wires 215-1, 215-2 are connected to the output impedance matching networks, while second ends of bond wires 217-1, 217-2 are connected to output leads 219-1, 219-2.

The amplifier paths that include amplifier 202-1 and 202-2 are now described, and it should be understood that the component arrangements described in connection with the amplifier path that includes amplifier 202-1 may also apply to the amplifier path that includes amplifier 202-2.

Amplifier 202-1 (e.g., which includes a transistor such as transistor 102, FIG. 1) is coupled to output matching network 204-1 (e.g., output matching network 104, FIG. 1) by bond wires 215-1, and further coupled to an input matching network (e.g., input matching network 108, FIG. 1) that includes bond wires 234-1 (e.g., inductance 135, FIG. 1), circuitry 207-1, and bond wires 232-1 (e.g., inductance 132, FIG. 1). Gate supply lead 222-1 (or RF input lead 222-1) may provide a RF signal to the input matching network, which may in turn provide the RF signal to the gate terminal of amplifier 202-1.

As discussed previously, and according to an embodiment, the amplifier system includes both an internal baseband decoupling circuit (e.g., circuit 110, FIG. 1), and an external baseband decoupling circuit (e.g., circuit 106, FIG. 1). The input matching network, or more specifically circuitry 207-1, may be coupled to lead 201-1 through bond wires 214-1 (e.g., which may act as inductance 114, FIG. 1). Bond wires 214-1, which may carry bias voltage signals (e.g., gate bias voltage Vgg), may be arranged such that they are perpendicular to bond wires 232-1 and 234-1, which may primarily carry RF signals, in order to reduce coupling between bond wires carrying bias voltage signals and bond wires carrying RF signals (e.g., compared to arrangements in which these sets of bond wires are not arranged perpendicularly). Lead 201-1 may be a highly inductive bias lead that is connected to an external ground terminal (e.g., ground terminal 120, FIG. 1, which may be different from the ground plane of package 200) through an optional resistor or capacitor (e.g., capacitor 118, FIG. 1). Voltage biasing for the gate/control terminal of amplifier 202-1 may be applied through lead 201-1, which may replace quarter-wave bias lines that are conventionally used to provide such voltage biasing. For example, a DC bias voltage source (e.g., bias voltage source 150, FIG. 1) may be coupled to the bond pad in order to provide a gate bias voltage, Vgg. Bond wires 214-1 and lead 201-1 may have a cumulative series resistance (e.g., which contribute to resistance 116, FIG. 1).

Amplifier 202-2 (e.g., which includes a transistor such as transistor 102, FIG. 1) is coupled to output matching network 204-2 (e.g., output matching network 104, FIG. 1), and further coupled to input matching network 207-2; input matching network 108, FIG. 1) through bond wires 232-2 (e.g., inductance 132, FIG. 1). Input matching network 207-2 is coupled to gate supply lead 222-2 (or RF input lead 222-2) through bond wires 234-2. Gate supply lead 222-2 may provide a RF signal to input matching network 207-2, which may in turn provide the RF signal to the gate terminal of amplifier 202-2. Another instance of input matching network, or more specifically circuitry 207-2, may be coupled to lead 201-2 through bond wires 214-2 (e.g., which may act as inductance 114, FIG. 1). Bond wires 214-2, which may primarily carry bias voltage signals, may be arranged such that they are perpendicular to bond wires 232-2 and 234-2, which may primarily carry RF signals, in order to reduce coupling between bond wires carrying bias voltage signals and bond wires carrying RF signals (e.g., compared to arrangements in which these sets of bond wires are not arranged perpendicularly). Lead 201-2 may be a highly inductive bias lead that is connected to an external ground terminal (e.g., ground terminal 120, FIG. 1, which may be different from the ground plane of package 200) through an optional resistor and/or capacitor (e.g., capacitor 118, FIG. 1). Voltage biasing for the gate/control terminal of amplifier 202-2 may be applied through lead 201-2, which may replace quarter-wave bias lines that are conventionally used to provide such voltage biasing. For example, a DC bias voltage source (e.g., bias voltage source 150, FIG. 1) may be coupled to the bond pad in order to provide a gate bias voltage, Vgg. Bond wires 214-2 and lead 201-2 may have a cumulative series resistance.

Figure 3A:
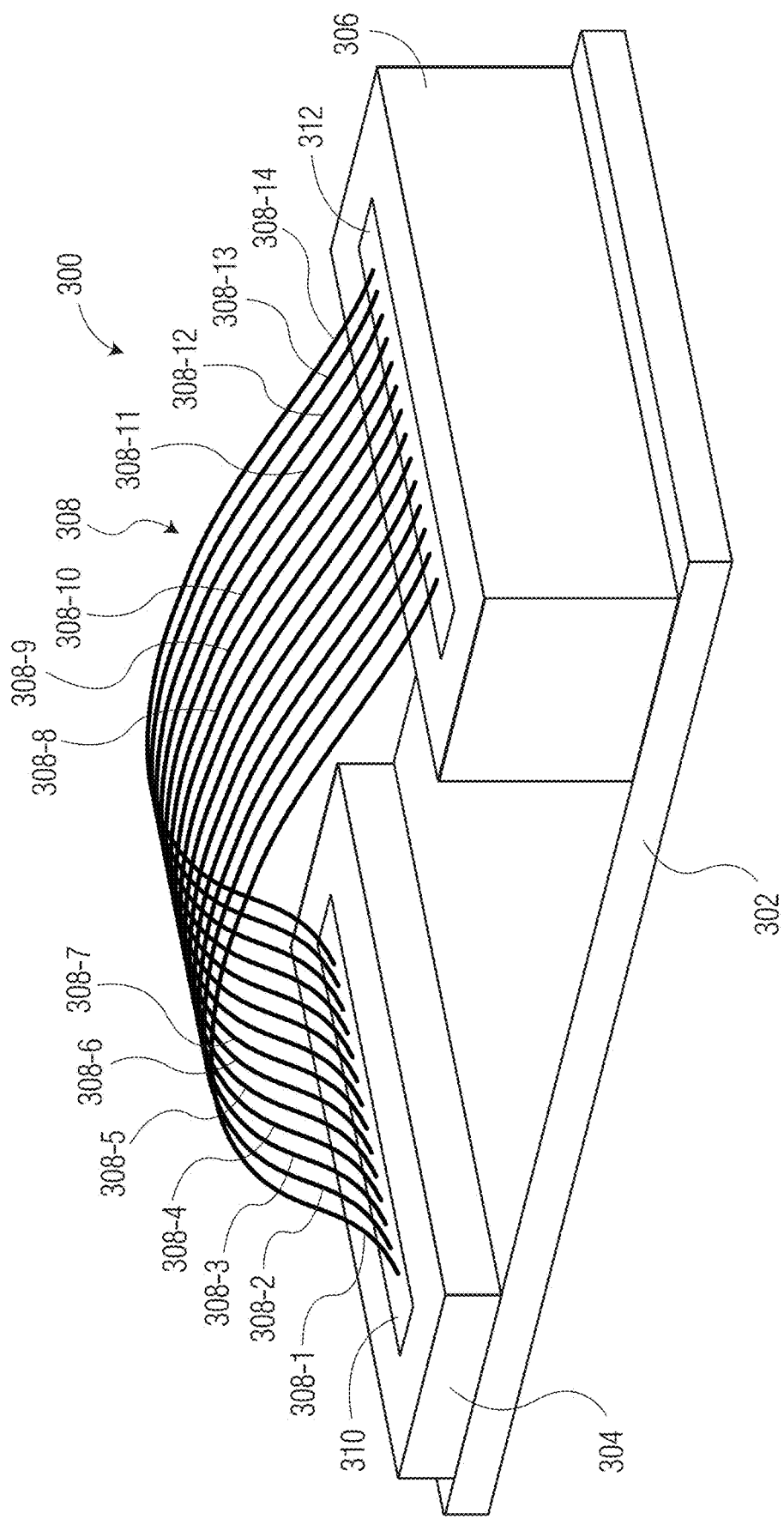
FIGS. 3A and 3B are perspective and side views, respectively, of a bond wire array that may be used to electrically interconnect electrical components, such as components of an RF semiconductor device such as device 100 of FIG. 1 or package 200 of FIG. 2.
Figure 3B:
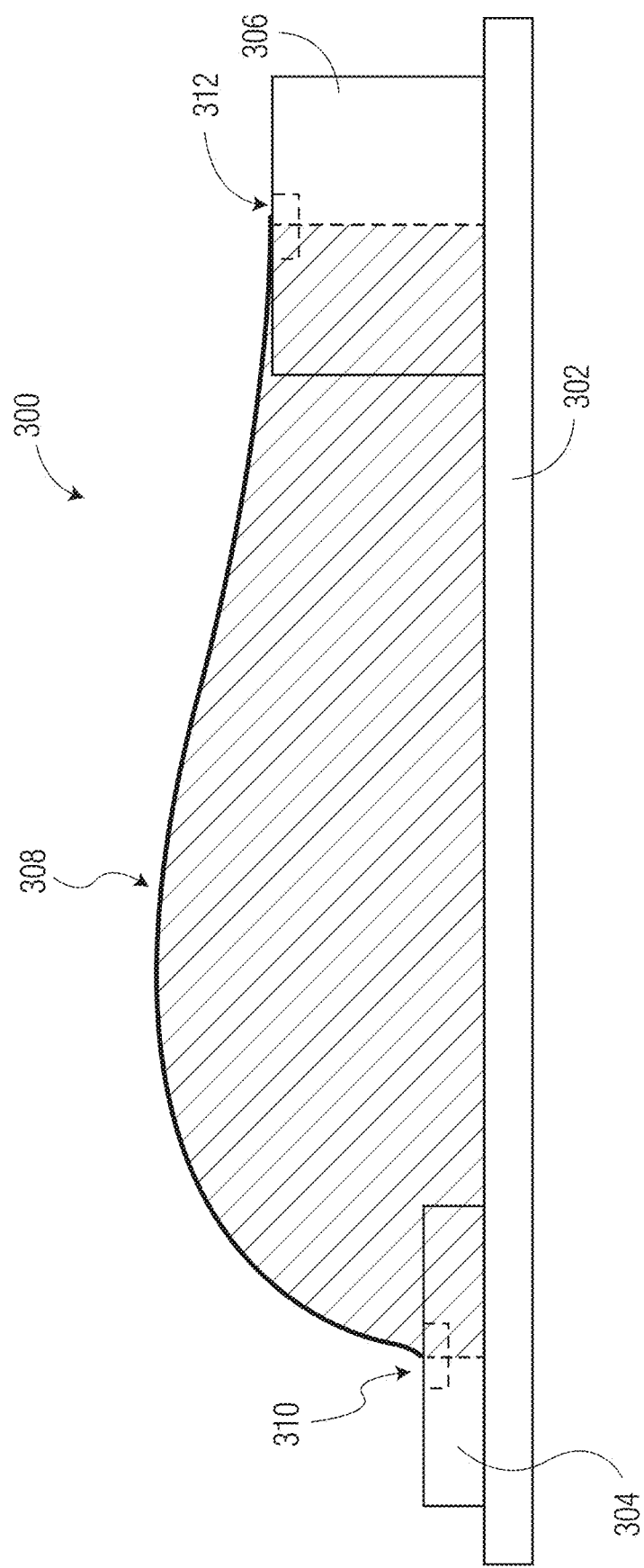

FIGS. 3A and 3B are perspective and side views, respectively, of a portion of a packaged device 300 that includes a substrate 302, an amplifier (transistor) die 304, an output lead 306, and a bond wire array 308 that may be used to electrically interconnect the transistor die output 310 to the output lead 306 at bond pad 312 (or to electrically interconnect other electrical components, such as components of an RF semiconductor device such as device 100 of FIG. 1 or package 200 of FIG. 2). In some embodiments, bond pad 312 may not be included and bond wires 308 may be electrically connected directly to a surface of output lead 306.

Bond wire array 308 may be used as any of bond wire arrays 215-1, 215-2, 217-1, 217-2, 234-1, 234-2, 232-1, 232-2 of FIG. 2. For example, bond wire array 308 may be used to electrically connect a transistor die output 310 to a package lead 306 (e.g., lead 219-1, 219-1, FIG. 2) or the transistor die output to a shunt L match integrated passive device (IPD) impedance matching structure (e.g., output matching network 204-1, 204-2, FIG. 2) or an output T match IPD impedance matching structure.

In a specific example, bond wire array 308 may be used as bond wire array 217-1 or 217-2 of FIG. 2. In that case, bond wire array 308 is connected between an output terminal 310 of a transistor device (e.g., output terminal of transistor 202-1 or 202-2 of FIG. 2) and an output lead 306 (e.g., lead 219-1, 219-2, FIG. 2) of the device.

As illustrated, bond wire array 308 includes a number of individual bond wires 308-1 through 308-14 for a total of 14 bond wires. As current flows through bond wire array 308 (e.g., from output terminal 310 of a transistor device (e.g., output terminal of transistor 202-1 or 202-2 of FIG. 2) and an output lead 306 (e.g., lead 219-1, 219-2, FIG. 2) of the device), the current is not equally distributed across each of bond wires 308-1 through 308-14. Because the inner wires of bond wire array (e.g., bond wires 308-3 through 308-12) exhibit high inductance, those bond wires 308 carry less current, while the outer bond wires 308-1, 308-2, 308-13, and 308-14 carry more current.

Figure 4:
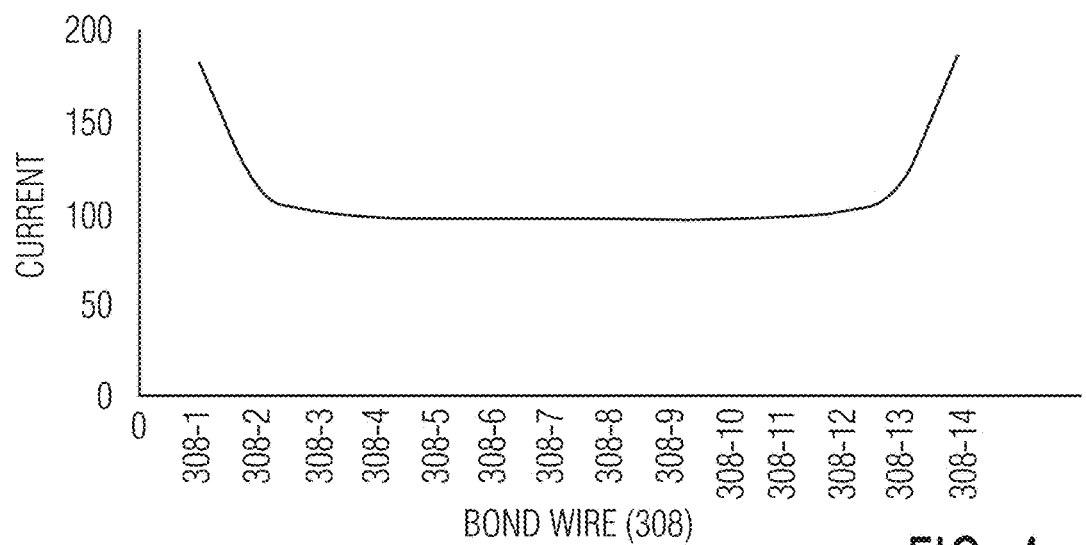
FIG. 4 is a chart depicting current flow through each bond wire of the bond wire array of FIGS. 3A and 3B.

To illustrate, FIG. 4 is a chart depicting current flow through each bond wire 308 of bond wire array 308 for a typical application of an RF semiconductor device in which bond wire array 308 may be installed. The vertical axis of the graph represents the magnitude of current flowing through each bond wire 308, while positions along the horizontal axis are associated with each bond wire 308.

As depicted, the current flow is greatest through the outer bond wires 308-1 and 308-14, and the current flow is lowest through the inner bond wires 308-2 through 308-13. As such, the outer bond wires 308-1 and 308-14 carrying higher current will heat up more than the inner bond wires 308-2 through 308-13.

Figure 5:
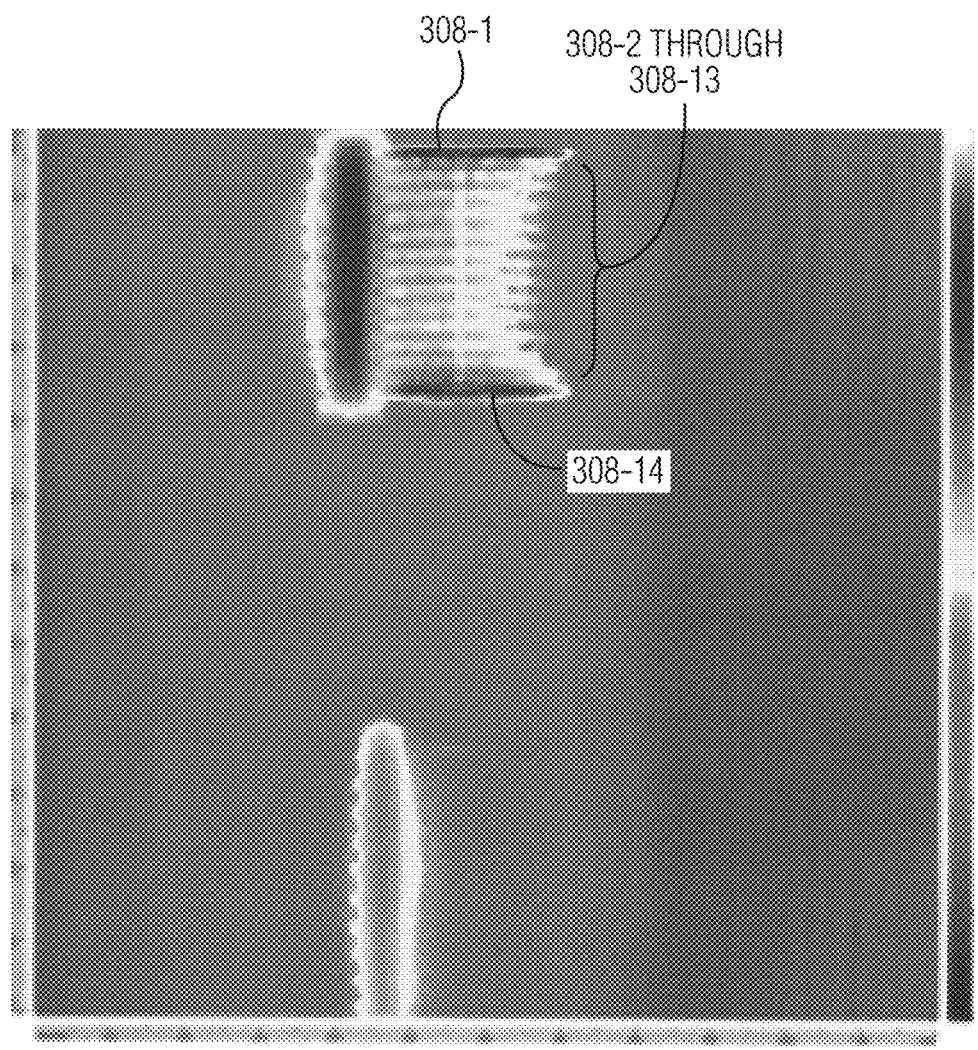
FIG. 5 is a thermal image of a bond wire array.

FIG. 5 is a thermal image of bond wire array 308 taken during operation. As depicted, the outer most bond wires (e.g., bond wires 308-1 and 308-14) are warmer than the inner bond wires 308.

This excessive heating of the outermost bond wires 308 of bond wire array 308 can limit the performance of bond wire array 308 (and the components to which bond wire array 308 is connected) by reducing the maximum current load that can be handled by bond wire array 308. Specifically, the maximum current passed through bond wire array 308 must be limited so that the outermost bond wires 308 do not exceed their maximum operational temperatures. As a consequence, the inner bond wires 308 (e.g., bond wires 308-3-308-12) will be carrying less than a maximum current that could otherwise pass through those bond wires 308.

A bond wire array may be configured to reduce the inductance of the inner bond wires of the array as compared to the inductance of the array's outer bond wires. By reducing the inductance of the inner bond wires, more current is forced through the inner bond wires and, conversely, less current through the outer bond wires. This reduces the temperature increases in the outer bond wires, enabling more current to be passed through the bond wire array or, alternatively, thinner or higher inductance bond wires to be used within the bond wire array.

In an embodiment, the inductance of the inner bond wires is reduced by reducing the ground loop area associated within the inner bond wires as compared to the outer bond wires. The ground loop area for bond wires 308 is illustrated by the dashed region in FIG. 3B. As illustrated, the ground loop area is (in cross section) the actual area defined by the shape of the signal bond wires and the top surface of the flange, which is the ground for device 300. The greater the ground loop area for a particular bond wire, the greater the inductance of that bond wire. Accordingly, by reducing the ground loop area for inner bond wires, the inductance of those bond wires can be reduced.

Specifically, the ground loop area for the inner bond wires of a bond wire array can be reduced by positioning a grounded conductive structure, such as grounded bond wires directly underneath the inner bond wires of the array. The grounded bond wires are not positioned underneath the outer bond wires of the array, only underneath the inner bond wires of the array, in an embodiment. The grounded bond wires are positioned in proximity to the inner bond wires of the array and reduce the ground loop area associated with those inner bond wires. The ground loop area for the outer bond wires of such an array is unchanged.

By reducing the ground loop area for the inner bond wires, the inductance of those bond wires is reduced, effectively forcing more current to flow through the inner bond wires (that are each coupled with a grounded bond wire) than the outer bond wires.

Figure 6A:
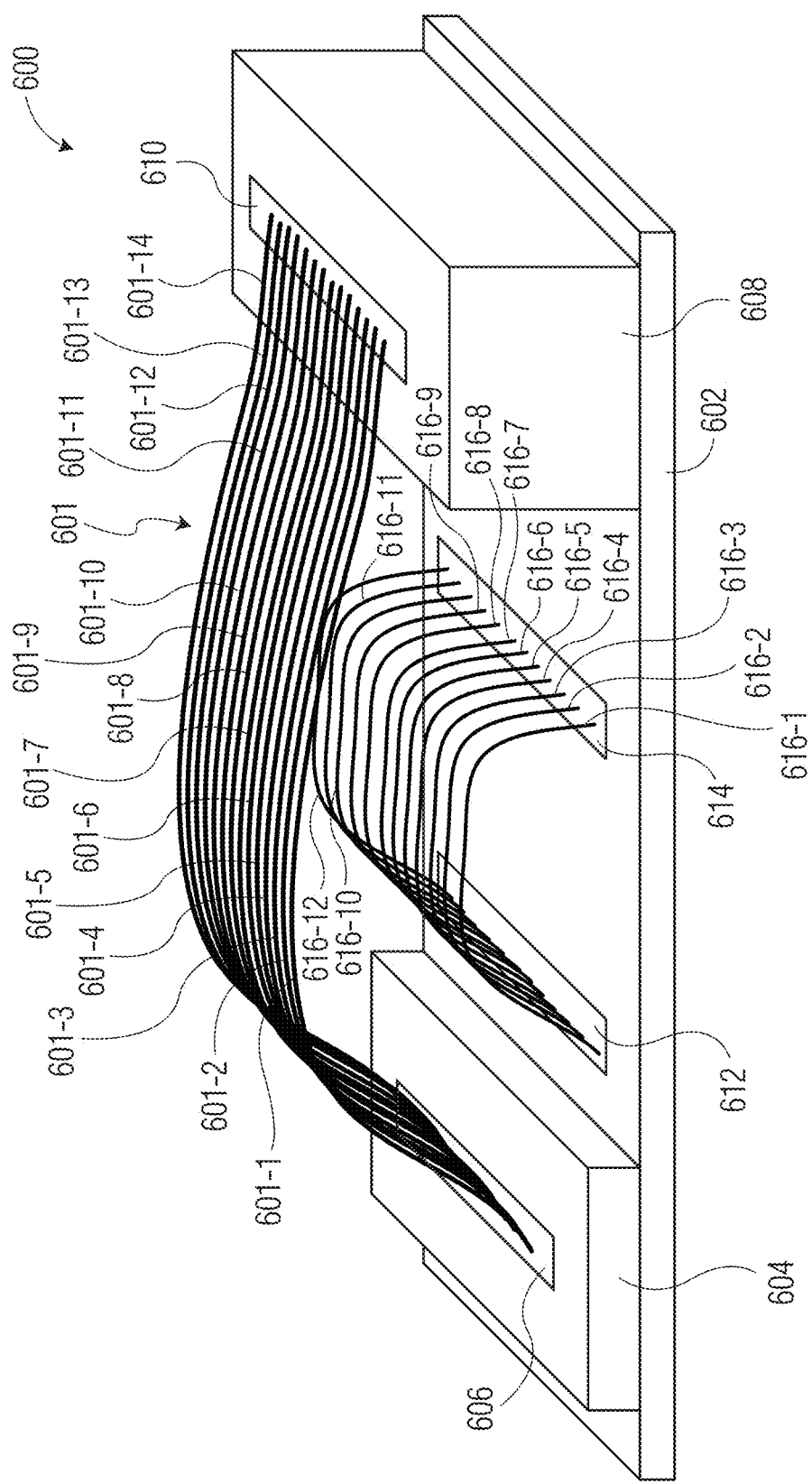
FIGS. 6A, 6B, and 6C are first perspective, second perspective, and side views, respectively, of a bond wire array that may be used to electrically interconnect components of an RF semiconductor device.
Figure 6B:
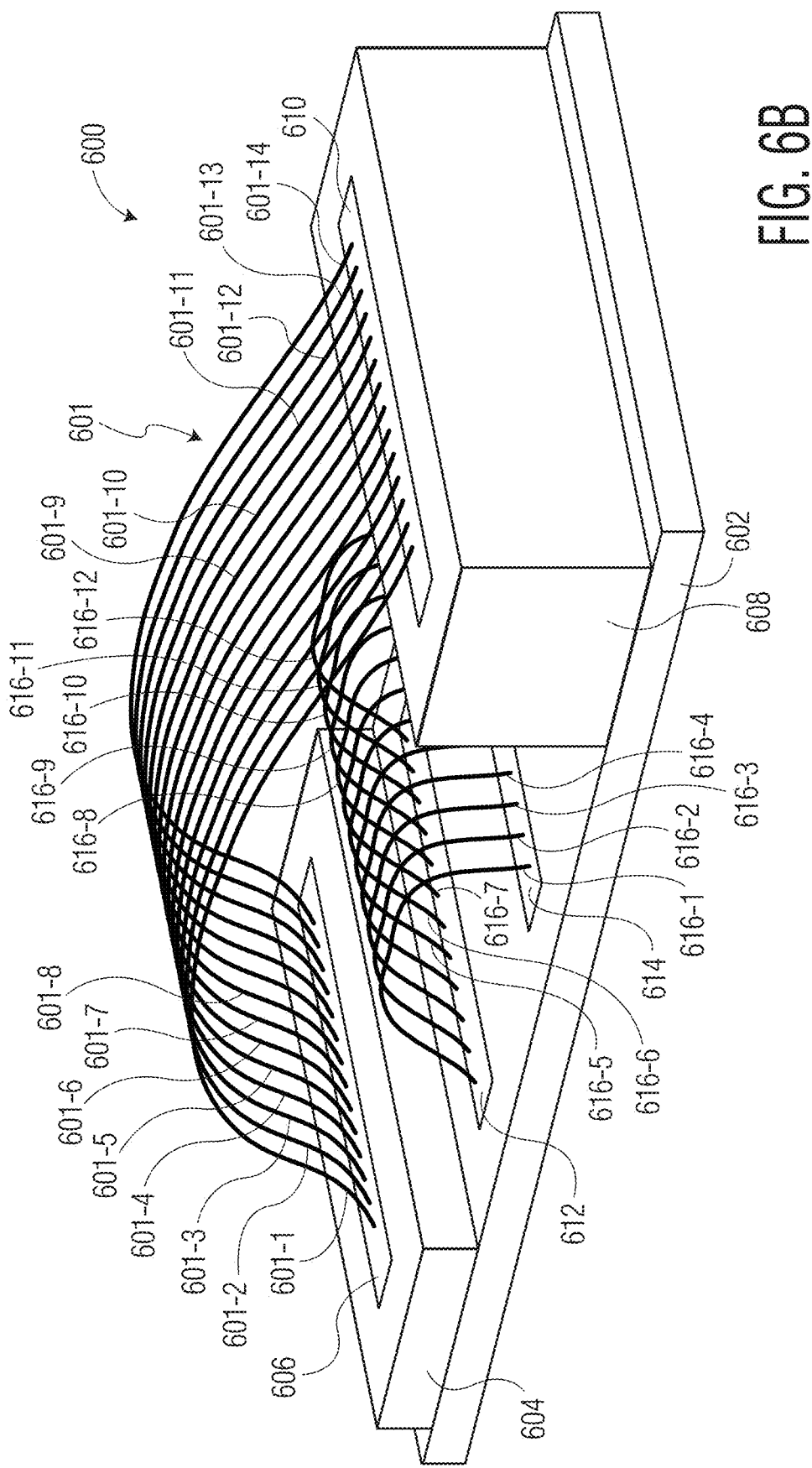
Figure 6C:
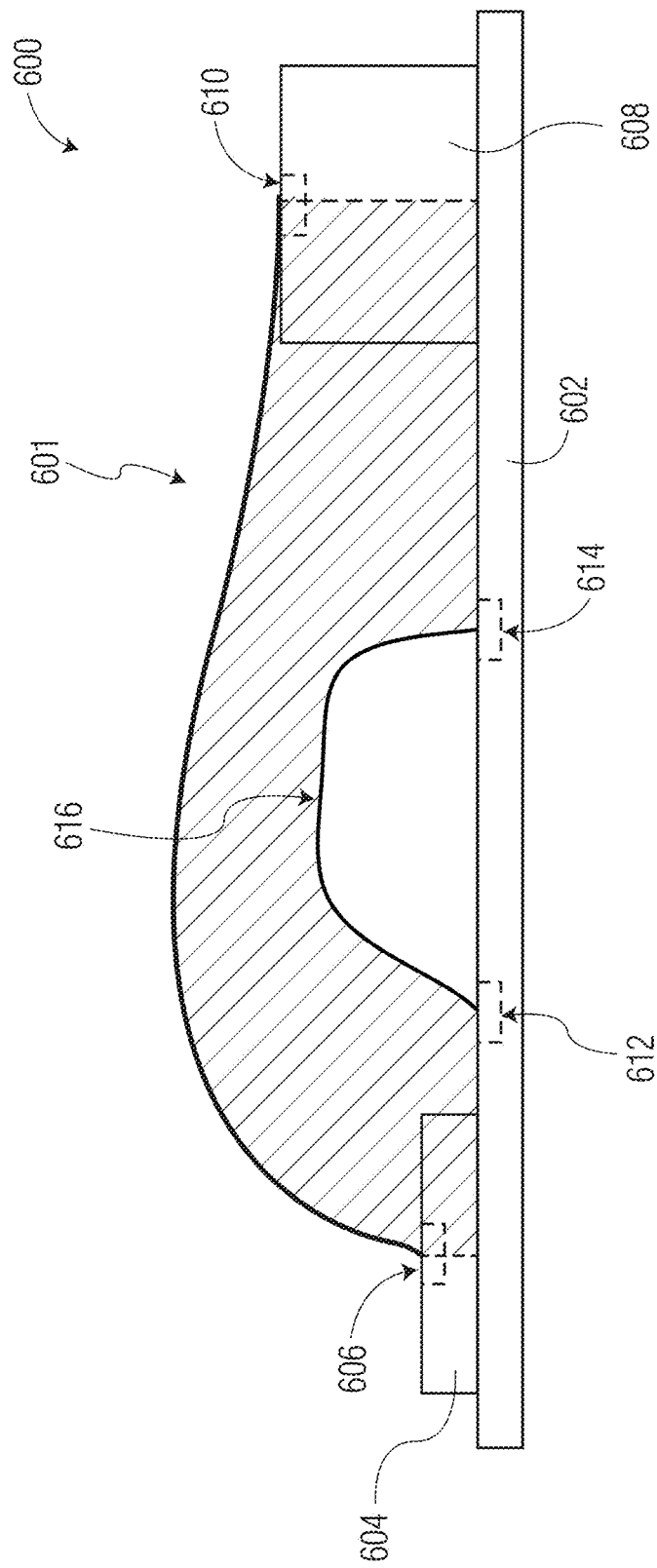

FIGS. 6A, 6B, and 6C are first perspective, second perspective, and side views, respectively, of packaged device 600 including a bond wire array 601 that may be used to electrically interconnect electronic components of an RF semiconductor device such as device 100 of FIG. 1 or package 200 of FIG. 2. For example, bond wire array 601 may be used as any of bond wire arrays 215-1, 215-2, 217-1, 217-2, 234-1, 234-2, 232-1, 232-2 of FIG. 2. Bond wire array 601 may be used to electrically connect an output of an amplifier device (die) or a transistor die output to a package lead, a shunt L match IPD impedance matching structure, or an output T match IPD impedance matching structure.

In a specific example, bond wire array 601 may be used as bond wire array 217-1 or 217-2 of FIG. 2. In that case, bond wire array 601 is connected between an output terminal 606 of a transistor die 604 or amplifier die (e.g., output terminal of transistor 202-1 or 202-2 of FIG. 2) mounted over a surface of the device 600's substrate 602 or flange and an optional bond pad 610 formed on a surface of an output lead 608 (e.g., lead 219-1, 219-2, FIG. 2) of the device. Output lead 608 is mounted to substrate 602, but is electrically isolated from substrate 602 (e.g., by a dielectric spacer not shown on FIGS. 6A-6C). In this configuration, bond wire array 601 includes signal-carrying bond wires.

As illustrated, bond wire array 601 includes a number of individual bond wires 601-1 through 601-14 for a total of 14 bond wires. An additional array of grounded bond wires 616-1 through 616-12 are formed underneath bond wires 601 in the space between the top surface of substrate 602 and bond wires 601-1 through 601-14. Grounded bond wires 616 may be formed from the same conductive material as bond wires 601 and using similar fabrication techniques. In an embodiment, grounded bond wires 616 are connected, at each end, to grounded bond pads 612 and 614 that are formed on the top surface of substrate 602 and that may be connected, in turn, to a ground potential for the RF semiconductor device. In some embodiments, however, grounded bond pads 612 and 614 may be connected directly to substrate 602, which may include a conductive material and is itself connected to a ground potential. To facilitate the mechanical and electrical coupling of grounded bond wires 616 to the top surface of substrate 602, bond pads 612 and 614 may be material coated over substrate 602 to facilitate the soldering of grounded bond wires 616 to substrate 602. As such, grounded bond wires 616 are not signal-carrying wires and instead are maintained at a constant ground potential.

As illustrated in FIGS. 6A, 6B, and 6C grounded bond wires 616 may only be positioned under the inner bond wires 601-2 of 601-13 of the bond wire array 601 and grounded bond wires 616 are not positioned underneath the outer bond wires 601-1 and 601-14 of the bond wire array 601. In other words, ground bond wires 616 may be excluded directly under the outer bond wires 601-1 and 601-14. Specifically, each individual grounded bond wire 616 from the set of grounded bond wires 616 is positioned under one of the inner bond wires 601-2 through 601-13 of bond wire array 601. In an embodiment, a minimum distance between each grounded bond wire 616 and its nearest inner bond wire 606-2 through 606-13 may be equal to or less than a minimum pitch distance (i.e., a minimum distance) between the bond wires of bond wire array 601 or grounded bond wire array 616.

In an embodiment, each individual bond wire of grounded bond wires 616 is located directly underneath one of the inner bond wires 601-2 to 601-13 of the bond wire array 601. In other words, the maximum height of each ground bond wire 616 above the top surface of the substrate 602 is less than the maximum height of each of the inner bond wires 601-2 to 601-13 above the top surface of the substrate 602. In the depicted embodiment, each individual bond wire of ground bond wires 616 is generally parallel to its nearest bond wire 601. Additionally, in the depicted embodiment, grounded bond wire 616-1 is directly underneath bond wire 601-2 so that both ground bond wire 616-1 and bond wire 601-2 each run along a plane formed perpendicularly to a surface of substrate 602. In other embodiments, however, individual ground bond wires 616 may be laterally offset from their nearest bond wires 601 so that the ground bond wires 616 are not positioned directly underneath their nearest bond wires 601. In some embodiments ground bond wires 616 may be laterally offset from their nearest bond wires 601 by a maximum distance of half the minimum pitch spacing between the bond wires of bond wire array 601 or grounded bond wire array 616.

In the configured depicted in FIGS. 6A, 6B, and 6C, the ground loop area for the outer bond wires 601-1 and 601-14 is generally unchanged from the bond wire array depicted in FIGS. 3A and 3B as the ground loop area has a perimeter defined by the outer bond wires 601-1 and 601-14 themselves and the top surface of substrate 602. But for bond wires 601-2 through 601-13 that are each formed directly over one of grounded bond wires 616, the ground loop area, indicated by the dashed region of FIG. 6C, has been reduced, thereby reducing the inductance of those bond wires 601-2-601-13. Specifically, the ground loop area for bond wires 601-2 through 601-13 has a perimeter defined by each of bond wires 601-2 through 601-13 and their nearest grounded bond wire 616, which are nearer to bond wires 601-2 through 601-13 than the top surface of substrate 602.

As current flows through bond wire array 601 (e.g., from an output terminal of transistor 202-1 or 202-2 of FIG. 2 to an output lead 219-1, 219-2 of FIG. 2), the inductance of each of bond wires 601-1 through 601-14 has been normalized so that the various inductances of each bond wire 601 is closer than in conventional designs resulting in more equal current distribution across each of bond wires 601-1 through 601-14.

Figure 7:
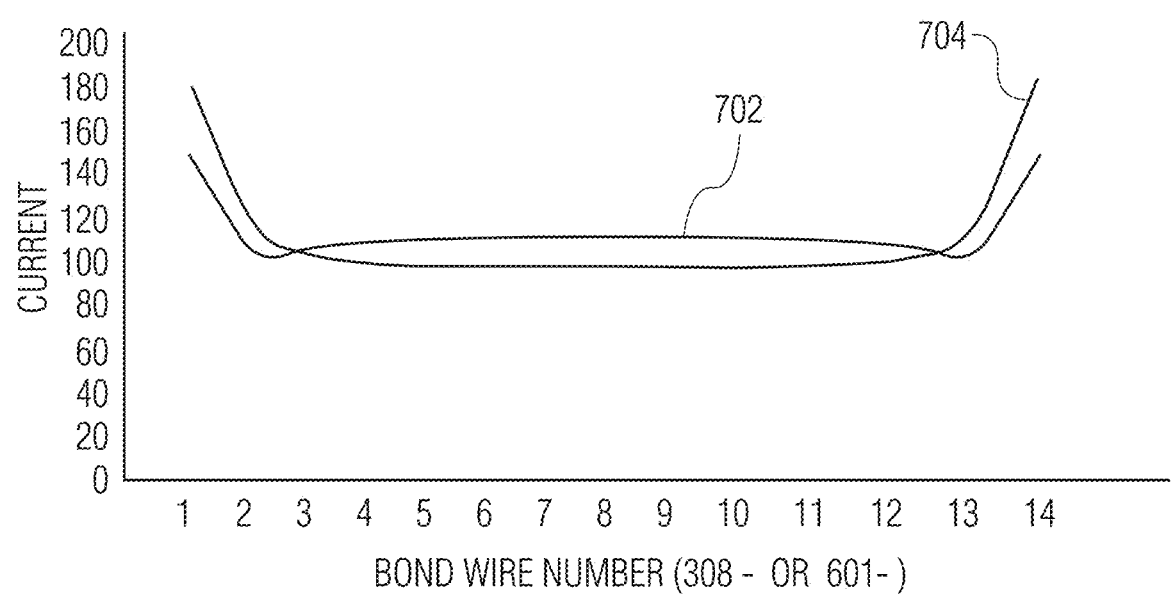
FIG. 7 is a chart depicting current flow through bond wires of bond wire arrays that include the bond wire array depicted in FIGS. 6A-6C.

To illustrate, FIG. 7 is a chart depicting current flow through bond wires 601 of bond wire array 601 for a typical application of an RF semiconductor device in which bond wire array 601 may be installed. Specifically, trace 702 shows current flow through bond wires 601, while trace 704 shows current flow through the bond wires of a conventional bond wire array (e.g., bond wire array 308 of FIGS. 3A and 3B). The vertical axis of the graph represents the magnitude of current flowing through each bond wire, while positions along the horizontal axis are associated with each bond wire of bond wire array 601 (i.e., bond wires 601-1 through 601-14) (trace 702) and the bond wires of a conventional array (e.g., bond wires 308-1 through 3086-14) (trace 704).

As depicted, in bond wires 601 depicted by trace 702, the current flow in the outermost bond wires (e.g., bond wires 601-1 and 601-14) is reduced as compared to those of the outer most bond wires of the conventional array (as depicted by trace 704). In contrast, for bond wire array 601, the current flow through the inner bond wires (e.g., bond wires 601-4-601-11) has been increased over that of the inner bond wires of the conventional bond wire array. As such, in bond wire array 601, current flow is being redirected from the outermost bond wires 601 to the inner bond wires 601. This normalizes current flow through bond wire array 601 enabling an increase in overall current flowing the bond wire array 601 while preventing excessive heating of individual bond wires and, specifically, the outermost bond wires 601-1 and 601-14.

It should be understood that although bond wire array 601 is depicted as including 14 bond wires, the use of grounded bond wires 616 in the manner depicted in FIGS. 6A-6C to normalize current distribution over a bond wire array is applicable to bond wire arrays including any number of bond wires, such as arrays including 8, 10, or 15 bond wires. Additionally, although the examples depicted in FIGS. 6A-6C show 12 individual grounded bond wires 616, implementations may include a different number of grounded bond wires 616. For example, in a configuration in which bond wire array 601 includes 14 bond wires 601 (i.e., bond wires 601-1 through 601-14), an implementation may provide only 10 grounded bond wires 616. In that case, only the innermost 10 bond wires of bond wire array 601 (i.e., bond wires 601-3 through 601-12) may each be formed over or in proximity to one of the 10 grounded bond wires 616. As such, in various embodiments, different numbers of grounded bond wires 616 may be implemented in combination with different numbers of bond wires 601 to provide adequate current normalization across each of bond wires 601.

In general, embodiments of bond wire array 601 include a number of grounded bond wires 616 that is less than the number of bond wires in array 601. Each of the grounded bond wires 616 may be made from the same material and using the same fabrication techniques as the bond wires of array 601, though different materials and/or fabrication techniques may be utilized.

Each of bond wires 601 may be of the same general constructions (i.e., size and shape), though in some embodiments, the size of two or more of grounded bond wires 616 may be different from one another. For example, grounded bond wires 616 positioned under the inner most bond wires 601 of bond wire array 601 (i.e., grounded bond wires 616-3 through 616-10) may be larger in size (i.e., longer in length and having a greater maximum height) so as to make the ground loop area for bond wires 601-4 through 601-11 smaller, whereas the outermost grounded bond wires 616-1, 616-2, 616-11, and 616-12 may be smaller in size (i.e., shorter in length and having a lesser maximum height), thereby increasing the ground loop area for bond wires 601-2, 601-3, 601-12, and 601-13 as compared to bond wires 601-4 through 601-11. Such a design may be utilized to force more current to the innermost bond wires, while reducing current flowing through the outer bond wires of bond wire array 601.

Although the embodiment depicted in FIGS. 6A-6C shows each of grounded bond wires 616 positioned directly underneath their respective bond wires 601, it should be understood that in some embodiments, the grounded bond wires 616 may be laterally offset from their respective bond wires 601 by a distance. In that case, each bond wire of grounded bond wires 616 may still be parallel to one or more bond wires 601, but may not be located directly underneath bond wires 601.

In still other embodiments, structures other than bond wires may be utilized to reduce the ground loop area for inner bond wires of bond wire array 601 (e.g., bond wires 601-2 through 601-13). For example, the collection of grounded bond wires 616 may be replaced with a single piece of conductive material, such as a flange or plate that is positioned underneath the inner bond wires (e.g., bond wires 601-2 through 601-13). The conductive flange or plate would then be connected to a ground potential thereby reducing the ground loop area for the inner bond wires and their inductance as compared to the outer bond wires (e.g., bond wires 601-1 and 601-14). In that case, the conductive material may be implemented by raising a portion of a ground flange above a substrate layer of the RF semiconductor device underneath the inner bond wires 601.

The grounded flange or plate in some embodiments, may instead be positioned over bond wires 601 so that bond wires 601 are between substrate 602 and the grounded flange or plate. In that case, the grounded flange or plate structure may be mounted to a bottom surface of a lid of a package structure containing bond wire array 601.

In other embodiments, a grounded structure underneath the inner bond wires 601 may be formed from a number of grounded vias formed in a substrate of the RF semiconductor device underneath bond wires 601.

In some cases, current distribution across the bond wires of a bond wire array may be at least partially normalized by modifying a shape of the outermost bond wires or the array. For example, by modifying the shapes of the outermost bond wires to increase their ground loop areas as compared to the inner bond wires, the inductance of the outermost bond wires can be increased compared to the inner bond wires, resulting in increased current flow through the inner bond wires.

Figure 8A:
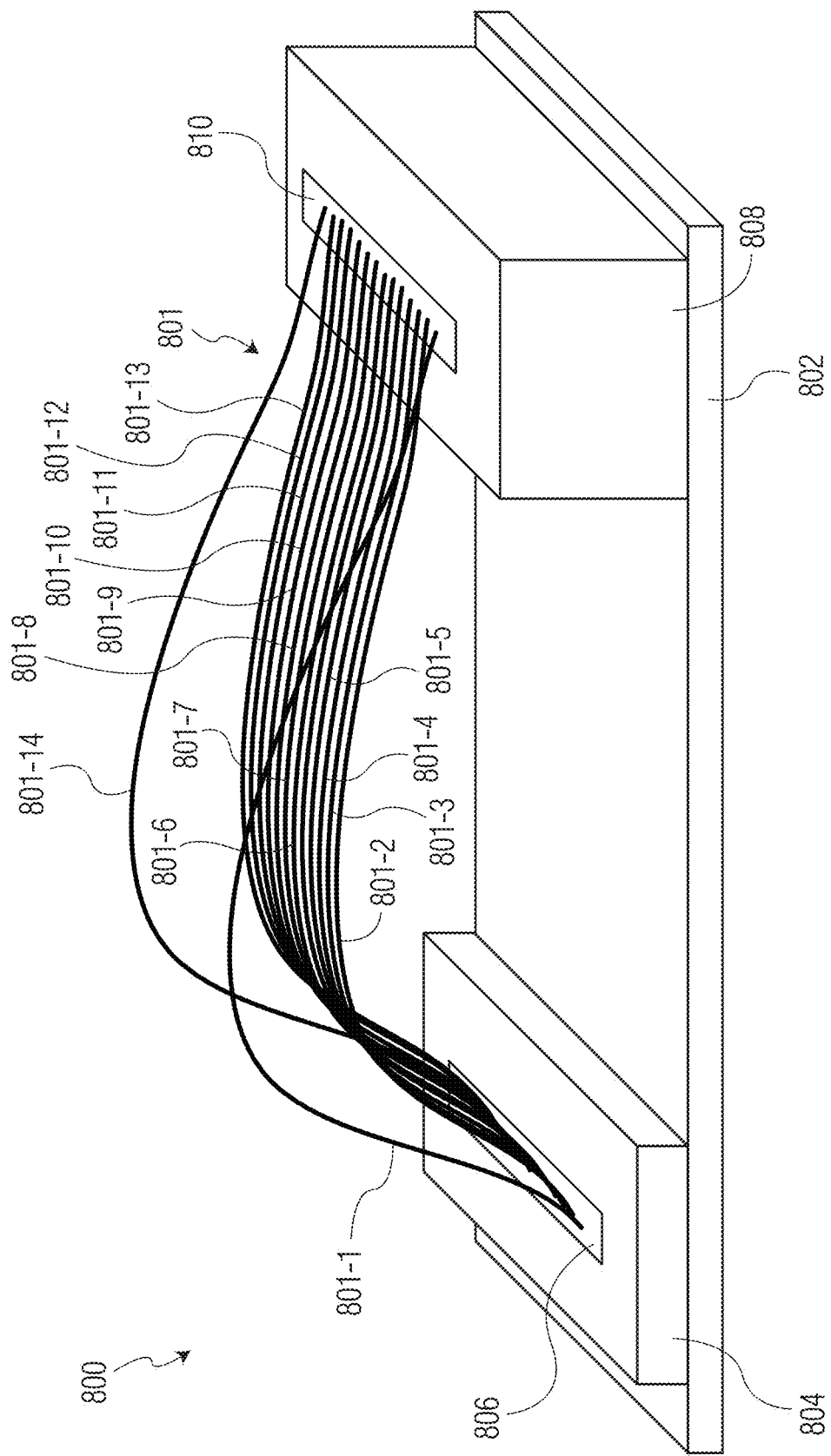
FIGS. 8A, 8B, and 8C are first perspective, second perspective, and side views, respectively, of a bond wire array that may be used to electrically interconnect components of an RF semiconductor device.
Figure 8B:
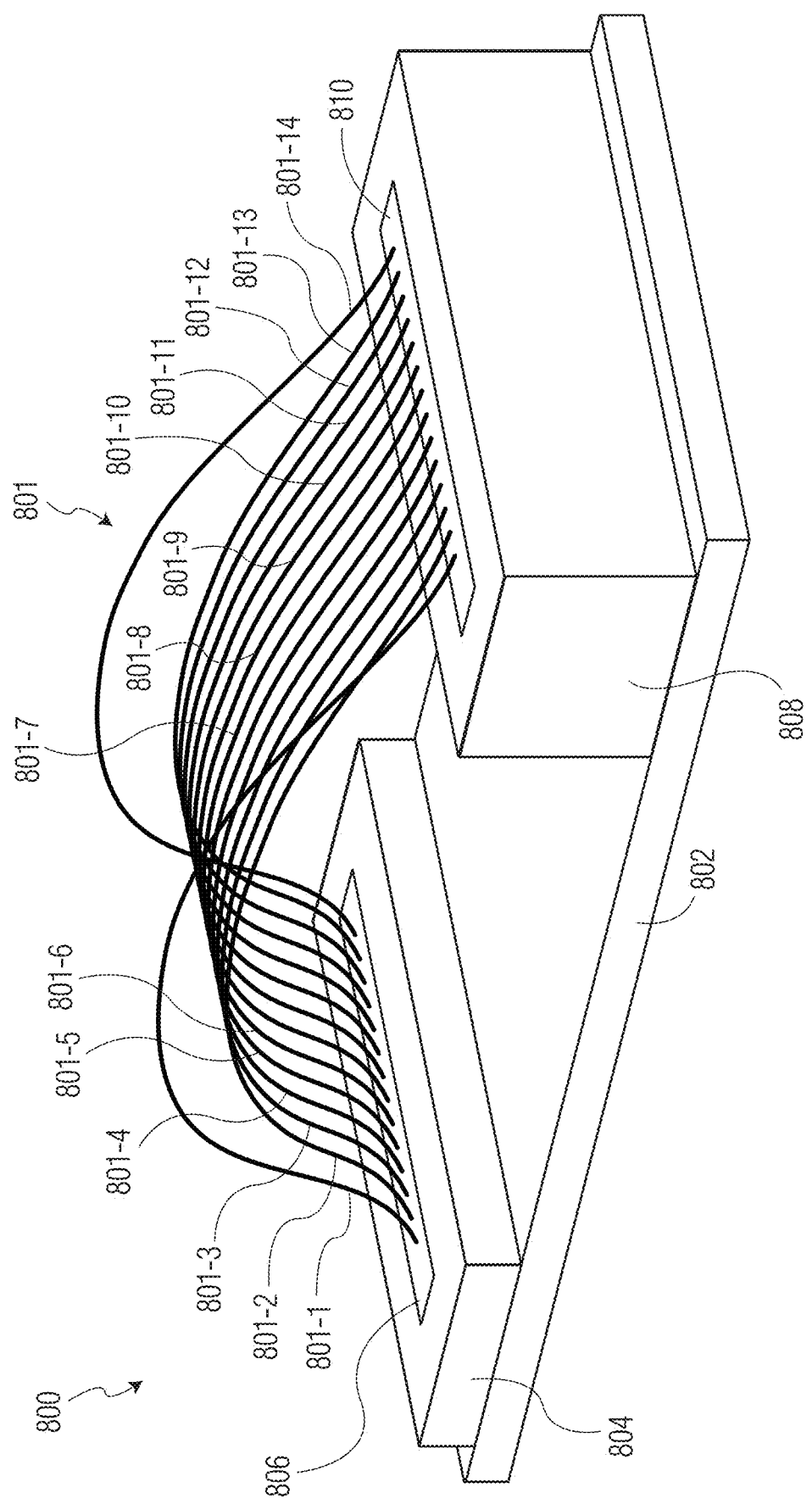
Figure 8C:
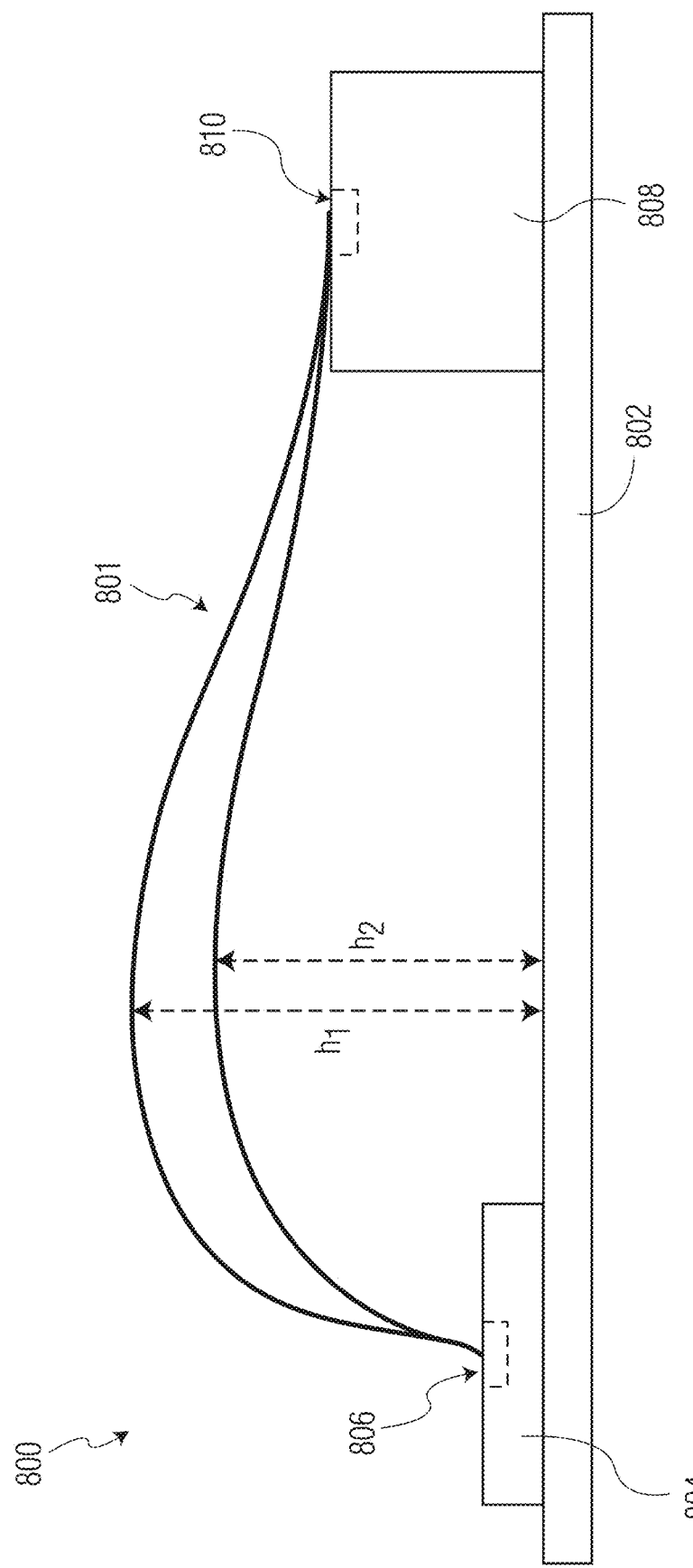

FIGS. 8A, 8B, and 8C are first perspective, second perspective, and side views, respectively, of a packaged device 800 including bond wire array 801. Bond wire array 801 may be used to electrically interconnect electronic components of an RF semiconductor device such as device 100 of FIG. 1 or package 200 of FIG. 2. For example, bond wire array 801 may be used as any of bond wire arrays 215-1, 215-2, 217-1, 217-2, 234-1, 234-2, 232-1, 232-2 of FIG. 2. In some embodiments, bond wire array 801 electrically connects a transistor or amplifier die output to a package lead, a shunt L match IPD impedance matching structure, or an output T match IPD impedance matching structure.

In a specific example, bond wire array 801 may be used as bond wire array 217-1 or 217-2 of FIG. 2. In that case, bond wire array 801 is connected between an output terminal 806 of transistor die 804, which is mounted to a top surface of substrate (flange) (e.g., an output terminal of transistor 202-1 or 202-2 of FIG. 2) and an optional bond pad 810 of output lead 808 (e.g., lead 219-1, 219-2, FIG. 2) of the device. Output lead 808 is mounted to substrate 802, but is electrically isolated from substrate 802 (e.g., by a dielectric spacer).

As illustrated, bond wire array 801 includes a number of individual bond wires 801-1 through 801-14 for a total of 14 bond wires. The outer bond wires 801-1 and 801-14 have a different length and shape than the inner bond wires 801-2 through 801-13. Specifically, outer bond wires 801-1 and 801-14 are shaped so as to have a longer length and a greater maximum height (see dimension $h_1$ on FIG. 8C) above substrate 802 than inner bond wires 801-2 through 801-13 (see dimension $h_2$ on FIG. 8C). In an embodiment, outer bond wires 801-1 and 801-14 are shaped to have a length that is at least 1 percent greater than at least one of inner bond wires 808-2 through 808-13 enabling the outer bond wires 801-1 and 801-14 to have a greater maximum height and establish a larger ground loop area than inner bond wires 808-2 through 808-13. In still other embodiments, the lengths and maximum heights (and corresponding ground loop areas) of various bond wires 801 may be adjusted to achieve a desired current normalization through bond wire array 801. In some cases, the lengths and heights of the bond wires 801 in bond wire array 801 above substrate 802 may vary by about 3 percent from one another to achieve desired current normalization.

Because outer bond wires 801-1 and 801-14 are longer in length then bond wires 801-2 through 801-13, the ground loop area for the outer bond wires 801-1 and 801-14 has been increased as compared to the ground loop areas for bond wires 801-2 through 801-13. This modification normalizes the inductance of the bond wires of bond wire array 801. And, as such, when current flows through bond wire array 801 the inductances of each of bond wires 801-1 through 801-14 are equal or nearly equal, resulting in a equalized current passing through each of bond wires 801-1 through 801-14.

Figure 9:
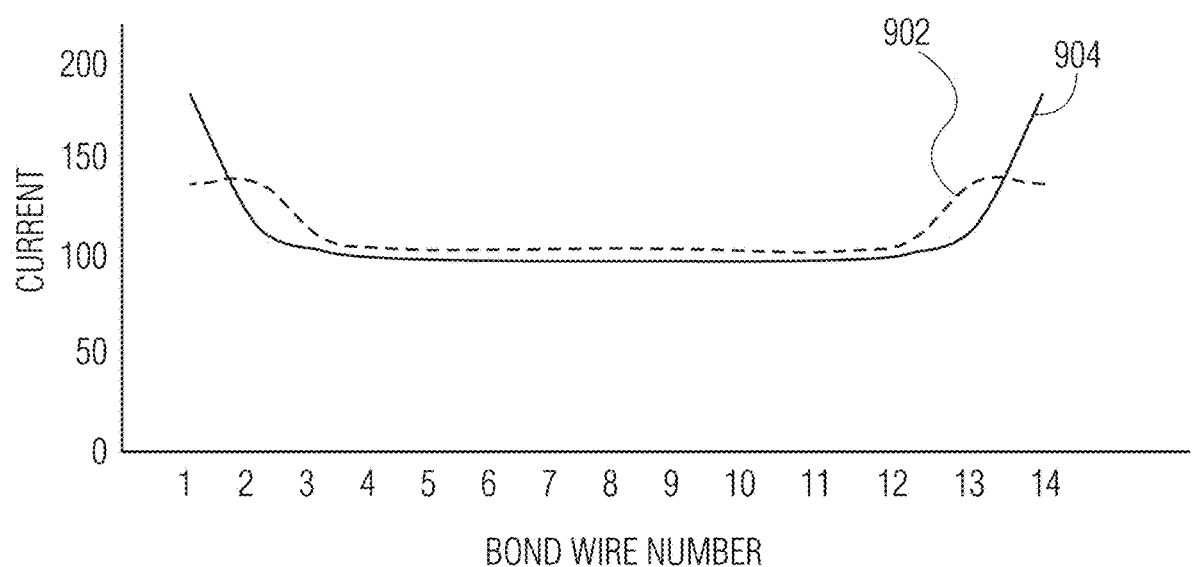
FIG. 9 is a chart depicting current flow through bond wires of bond wire arrays that include the bond wire array depicted in FIGS. 8A-8C.

To illustrate, FIG. 9 is a chart depicting current flow through bond wires 801 of bond wire array 801 for a typical application of an RF semiconductor device in which bond wire array 801 may be installed. Specifically, trace 902 shows current flow through bond wires 901, while trace 904 shows current flow through the bond wires of a conventional bond wire array (e.g., bond wire array 308 of FIGS. 3A and 3B). The vertical axis of the graph represents the magnitude of current flowing through each bond wire, while positions along the horizontal axis are associated with each bond wire of bond wire array 801 (trace 702) and the bond wires of a conventional array (trace 704).

In bond wires 801 as depicted by trace 702, the current flow in the outermost bond wires (e.g., 801-1 and 801-14) is reduced as compared to those of the outer most bond wires of the conventional array (as depicted by trace 704). In contrast, for bond wire array 801, the current flow through the inner bond wires (e.g., bond wires 801-2-801-13) has been increased over that of the inner bond wires of the conventional bond wire array. As such, in bond wire array 801, current flow is being redirected from the outermost bond wires 801 to the inner bond wires 801. This normalizes current flow through the bond wires 801 of bond wire array 801 enabling an increase in overall current flowing the bond wire array 801 while preventing excessive heating of individual bond wires and, specifically, the outermost bond wires 801-1 and 801-14.

It should be understood that although bond wire array 801 is depicted as including 14 bond wires, the concept of normalizing current distribution by modifying the shape of one or more bond wires in the bond wire array is applicable to bond wire arrays including any number of bond wires, such as arrays including 8, 10, or 15 bond wires. As such, in various embodiments, the shapes or lengths of different numbers of bond wires 801 may be modified to provide adequate current normalization across each of bond wires 801.

In some embodiments, a combination of the current normalization approaches depicted in FIGS. 6A-6C and 8A-8C and described herein may be implemented. Accordingly, for a particular bond wire array, in addition to incorporating a number of different grounded bond wires (e.g., grounded bond wires 616 of FIGS. 6A-6C) underneath a number of inner bond wires of the bond wire array, the lengths of the outer bond wires of the array may be increased along with their height above the device's substrate as compared to inner bond wires of the way to increase the inductance of those outer bond wires and thereby provide further current normalization.

In an embodiment, a device includes a substrate, and an amplifier die mounted to the substrate. The amplifier die has an output terminal. The device includes a first bond wire array including a first plurality of bond wires. First ends of each bond wire in the first plurality of bond wires are electrically coupled to the output terminal. The device includes a second bond wire array including a second plurality of bond wires. First and second ends of each bond wire in the second plurality of bond wires are electrically coupled to a ground reference. Each bond wire of the second plurality of bond wires is physically located between the first plurality of bond wires and the substrate.

In an embodiment, a device includes a substrate and a first electronic component mounted to the substrate. The first electronic component has a first terminal. The device includes a second electronic component mounted to the substrate. The second electronic component has a second terminal. The device includes a first bond wire array including a first plurality of bond wires. Each bond wire in the first plurality of bond wires is electrically coupled to the first terminal and the second terminal. A first maximum height of a first bond wire in the first plurality of bond wires above a top surface of the substrate is greater than a second maximum height of a second bond wire in the first plurality of bond wires above the top surface of the substrate.

In an embodiment, a packaged radio frequency (RF) amplifier device includes a flange and a transistor die mounted to the flange. The transistor die includes an output terminal. The packaged RF amplifier device includes a first bond wire array including a first plurality of bond wires. Each bond wire in the first plurality of bond wires is electrically coupled to the output terminal of the transistor die. A first ground loop area of a first bond wire in the first plurality of bond wires is greater than a second ground loop area of a second bond wire in the first plurality of bond wires.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising: a substrate; an amplifier die mounted to the substrate, the amplifier die having an output terminal; an electronic component mounted to the substrate, the electronic component having a terminal; a first bond wire array including a first plurality of bond wires, wherein first ends of each bond wire in the first plurality of bond wires are electrically coupled to the output terminal and second ends of each bond wire in the first plurality of bond wires are electrically coupled to the terminal of the electronic component, wherein the first plurality of bond wires includes a first outer bond wire, a second outer bond wire and a first inner bond wire, and a length of the first outer bond wire is greater than a length of the first inner bond wire and a length of the second outer bond wire is greater than the length of the first inner bond wire; and a second bond wire array including a second plurality of bond wires, wherein first and second ends of each bond wire in the second plurality of bond wires are electrically coupled to a ground reference and each bond wire in the second plurality of bond wires is physically located between at least one bond wire in the first plurality of bond wires and the substrate.

2. The device of claim 1, wherein the first plurality of bond wires includes a plurality of inner bond wires between the first outer bond wire and the second outer bond wire, and each bond wire in the second plurality of bond wires is between at least one inner bond wire and the substrate, and none of the bond wires in the second plurality of bond wires is between the first outer bond wire and the substrate, and none of the bond wires in the second plurality of bond wires is between the second outer bond wire and the substrate.

3. The device of claim 1, wherein a minimum distance between a first bond wire in the first bond wire array and a second bond wire in the second bond wire array is less than or equal to a minimum distance between the first bond wire in the first bond wire array and a second bond wire in the first bond wire array.

4. The device of claim 1, wherein a first height of the first outer bond wire above the substrate is greater than a second height of the first inner bond wire above the substrate.

5. The device of claim 1, wherein a first ground loop area of the first outer bond wire is greater than a second ground loop area of the first inner bond wire.

6. The device of claim 1, wherein the electronic component mounted to the substrate includes at least one of an output lead and an impedance matching network.

7. The device of claim 1, wherein the substrate is electrically coupled to the ground reference.

8. A device, comprising:
a substrate;
a first electronic component mounted to the substrate, the first electronic component having a first terminal;
a second electronic component mounted to the substrate, the second electronic component having a second terminal; and
a first bond wire array including a first plurality of bond wires, wherein each bond wire in the first plurality of bond wires is electrically coupled to the first terminal and the second terminal, a first maximum height of a first bond wire in the first plurality of bond wires above a top surface of the substrate is greater than a second maximum height of a second bond wire in the first plurality of bond wires above the top surface of the substrate, a second maximum height of a third bond wire in the first plurality of bond wires above the top surface of the substrate is greater than the second maximum height of the second bond wire in the first plurality of bond wires above the top surface of the substrate, and the first bond wire is a first outer bond wire in the first plurality of bond wires, the third bond wire is a second outer bond wire in the first plurality of bond wires, and the second bond wire is a first inner bond wire in the first plurality of bond wires.

9. The device of claim 8, wherein the first electronic component includes a transistor die, and the first terminal is an output terminal of the transistor die, and the second electronic component includes at least one of an output lead and an impedance matching network, and the first bond wire array is electrically coupled between the output terminal and the at least one of the output lead and the impedance matching network.

10. The device of claim 8, further comprising:
a second bond wire array including a second plurality of bond wires, wherein each bond wire in the second plurality of bond wires is electrically coupled to a ground reference and is physically located between at least one bond wire in the first plurality of bond wires and the substrate.

11. The device of claim 10, wherein the first plurality of bond wires includes a plurality of inner bond wires between the first outer bond wire and the second outer bond wire, and each bond wire in the second plurality of bond wires is physically located between at least one inner bond wire and the substrate and none of the bond wires in the second plurality of bond wires is between the first outer bond wire and the substrate and none of the bond wires in the second plurality of bond wires is between the second outer bond wire and the substrate.

12. The device of claim 10, wherein a minimum distance between a fourth bond wire in the first bond wire array and a fifth bond wire in the second bond wire array is less than or equal to a minimum distance between the first bond wire in the first bond wire array and the second bond wire in the first bond wire array.

13. The device of claim 8, wherein a first ground loop area of the first bond wire is greater than a second ground loop area of the second bond wire.

14. A packaged radio frequency (RF) amplifier device, comprising:
a flange;

a transistor die mounted to the flange, the transistor die including an output terminal;

an electronic component mounted to the flange, the electronic component having a terminal; and a first bond wire array including a first plurality of bond wires, wherein each bond wire in the first plurality of bond wires is electrically coupled to the output terminal of the transistor die and the terminal of the electronic component, a first ground loop area of a first bond wire in the first plurality of bond wires is greater than a second ground loop area of a second bond wire in the first plurality of bond wires, a third around loop area of a third bond wire in the first plurality of bond wires is greater than the second ground loop area of the second bond wire in the first plurality of bond wires, and the first bond wire is a first outer bond wire in the first plurality of bond wires, the third bond wire is a second outer bond wire in the first plurality of bond wires, and the second bond wire is a first inner bond wire in the first plurality of bond wires.

15. The packaged RF amplifier device of claim 14, wherein the electronic component includes an output lead and wherein each bond wire in the first plurality of bond wires is electrically coupled to the output lead.

16. The packaged RF amplifier device of claim 14, wherein a length of the first bond wire is at least 1 percent greater than a second length of the second bond wire and a first maximum height of the first bond wire above the flange is greater than a second maximum height of the second bond wire above the flange.

17. The packaged RF amplifier device of claim 14, further comprising:

a second bond wire array including a second plurality of bond wires, wherein each bond wire in the second plurality of bond wires is electrically coupled to the flange and is physically located between at least one bond wire in the first plurality of bond wires and the flange.

* * * * *